United States Patent [19]

Miyada

[11] Patent Number: 4,725,813

[45] Date of Patent: Feb. 16, 1988

[54] MOS TYPE CIRCUIT DEVICE

[75] Inventor: Yoshinori Miyada, Tokyo, Japan

[73] Assignee: NEC Corporation, Tokyo, Japan

[21] Appl. No.: 853,293

[22] Filed: Apr. 17, 1986

[30] Foreign Application Priority Data

Apr. 22, 1985 [JP] Japan ................................. 60-85813

[51] Int. Cl.$^4$ ............................................. H03M 1/66
[52] U.S. Cl. ............................. 340/347 DA; 307/571; 307/572; 307/299.1
[58] Field of Search ................... 307/299 R, 571, 572; 340/347 DA, 347 C

[56] References Cited

U.S. PATENT DOCUMENTS 4,529,897 7/1985 Suzuki et al. ...................... 307/571
4,638,241 1/1987 Colles .......................... 340/347 DA Primary Examiner—William M. Shoop, Jr.
Assistant Examiner—Richard K. Blum
Attorney, Agent, or Firm—Sughrue, Mion, Zinn Macpeak & Seas

[57] ABSTRACT

A MOS type circuit which has a high switching speed and which is free from the substrate bias effect includes a MOS transistor having a source electrode, a back gate region, a drain electrode and a gate electrode, and an amplifier having a gain of about "1", with the input and output of the amplifier being respectively coupled to the source electrode and the back gate electrode of the MOS transistor.

10 Claims, 5 Drawing Figures

MOS TYPE CIRCUIT DEVICE

BACKGROUND OF THE INVENTION

The present invention relates to a semiconductor integrated circuit device and, more particularly, to improvements in a circuit for applying a potential to a back gate of a MOS transistor. As is well known in the art, such as in NAND, NOR and EXOR gate, a P-channel MOS transistor in an N-well formed in a P-type substrate and an N-channel MOS transistor in a P-well formed in an N-type substrate can have source potentials different from the supply potential. Such an arrangement is also used with the MOS transistors which construct the differential amplifiers in an operational amplifier. In the conventional circuits, these MOS transistors have had their back gates (i.e., the wells insulated from the substrate) set at the same potential as the source, that is, at the highest potential in the case of P-channel MOS transistors, or at the lowest potential in the case of N-channel MOS transistors.

In a circuit in which the source potential is applied to the back gate of the MOS transistor by connecting the back gate directly to the source electrode, however, the large capacitance between the well forming the back gate and the substrate is applied to the source electrode. As a result, if the source potential fluctuates, the time period for charging or discharging this capacitance is elongated to invite a reduction in the switching speed.

In the circuit in which the back gate is connected to the source electrode, moreover, there arises another defect in that the substrate bias effect causes the threshold voltage to increase with an increase in the reverse bias voltage between the source electrode and the back gate.

SUMMARY OF THE INVENTION

Therefore, an object of the present invention is to provide a MOS type circuit having a high switching speed.

Another object of the present invention is to provide a MOS type circuit which is free from the substrate bias effect.

Yet another object of the present invention is to provide a MOS type circuit having a steady threshold potential.

A further object of the present invention is to provide a current summing type D/A converter.

According to the present invention, there is provided a MOS type circuit comprising a MOS transistor having source, drain and gate electrodes; and an amplifier having a gain of about "1", the input and the output of the amplifier being coupled to the source electrode and the back gate of the MOS transistor, respectively.

Other objects and features of the invention will be clarified by the following description, with reference to the accompanying drawings.

DETAILED DESCRIPTION OF THE PREFERRED EMBODIMENTS

Figure 1:
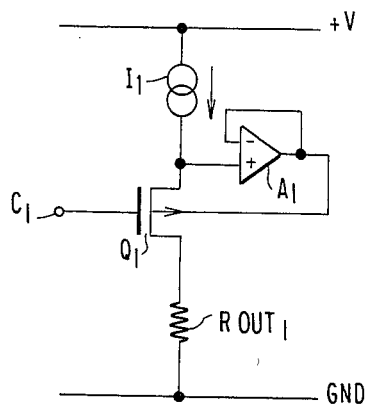
FIGS. 1 through 3 are circuit diagrams showing first through third embodiments of the present invention.

FIG. 1 is a circuit diagram showing a first embodiment of the present invention. A MOS transistor $Q_1$ is connected between a constant source $I_1$ and a load resistor $R_{OUT1}$ for switching the application of the constant current to the load resistor $R_{OUT1}$ in accordance with a clock input from an input terminal $C_1$. An amplifier A, having a gain of about "1" is provided with the source potential of the MOS transistor $Q_1$ and is connected to the back gate of the MOS transistor $Q_1$ at its output. The output of the amplifier is fed back to the inverting input thereof as shown in FIG. 1.

The large capacitance due to the PN junction between the back gate and substrate of the MOS transistor $Q_1$ is connected to the low-impedance output of the amplifier $A_1$ so that the capacitance at the source of the MOS transistor $Q_1$ is limited to the low input gate capacitance of the amplifier $A_1$. Since the source and the back gate of the MOS transistor $Q_1$ are connected through an amplifier $A_1$ having unity gain, moreover, their potentials are always kept at the same level. This eliminates any increase in the threshold voltage that might otherwise be caused by the substrate bias effect.

Figure 2:
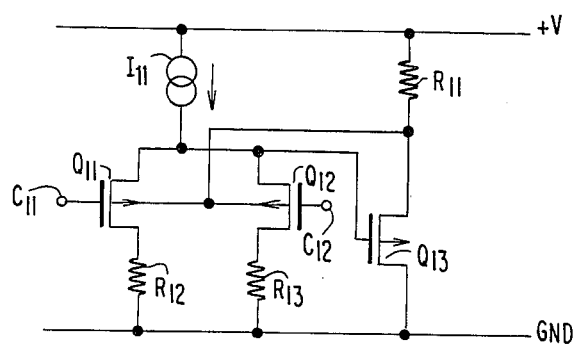

FIG. 2 illustrates a second embodiment of the present invention. MOS transistors $Q_{11}$ and $Q_{12}$ have their respective sources connected to a constant-current power supply $I_{11}$ and their respective drains connected to load resistors $R_{12}$ and $R_{13}$. The MOS transistors $Q_{11}$ and $Q_{12}$ switch the constant current from the constant-current power supply $I_{11}$ to the load resistors $R_{12}$, $R_{13}$ in accordance with the clock input or inputs from input terminals $C_{11}$ and $C_{12}$. A MOS transistor $Q_{13}$ has its gate connected to the sources of the MOS transistors $Q_{11}$ and $Q_{12}$ and its source connected to the back gates of the MOS transistors $Q_{11}$ and $Q_{12}$ and the resistor $R_{11}$. In this case, the MOS transistor $Q_{13}$ acts as a source follower amplifier having a gain of about "1". As a result, the operations of the MOS transistor $Q_{13}$ are the same as those of the amplifier $A_1$ of FIG. 1.

Figure 3:
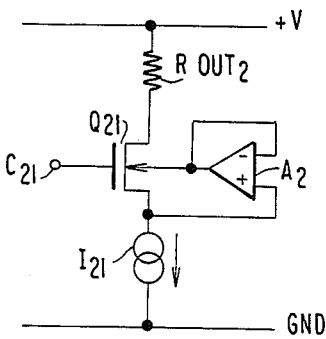

FIG. 3 shows a third embodiment of the present invention which is obtained by replacing the P-channel transistor $Q_1$ in the first embodiment with an N-channel MOS transistor $Q_{21}$. More specifically, the N-channel MOS transistor $Q_{21}$ has its gate connected to receive the clock input applied via input terminal $C_{21}$; has its drain connected with a load resistor $R_{OUT2}$ and its source connected to both a constant-current power supply $I_{21}$ and the input of an amplifier $A_2$ having a gain of about "1". The output of this amplifier $A_2$ is applied to the back gate of the N-channel MOS transistor $Q_{21}$. According to this circuit, similar operations and effects as in the first embodiment are obtainable.

Figure 4:
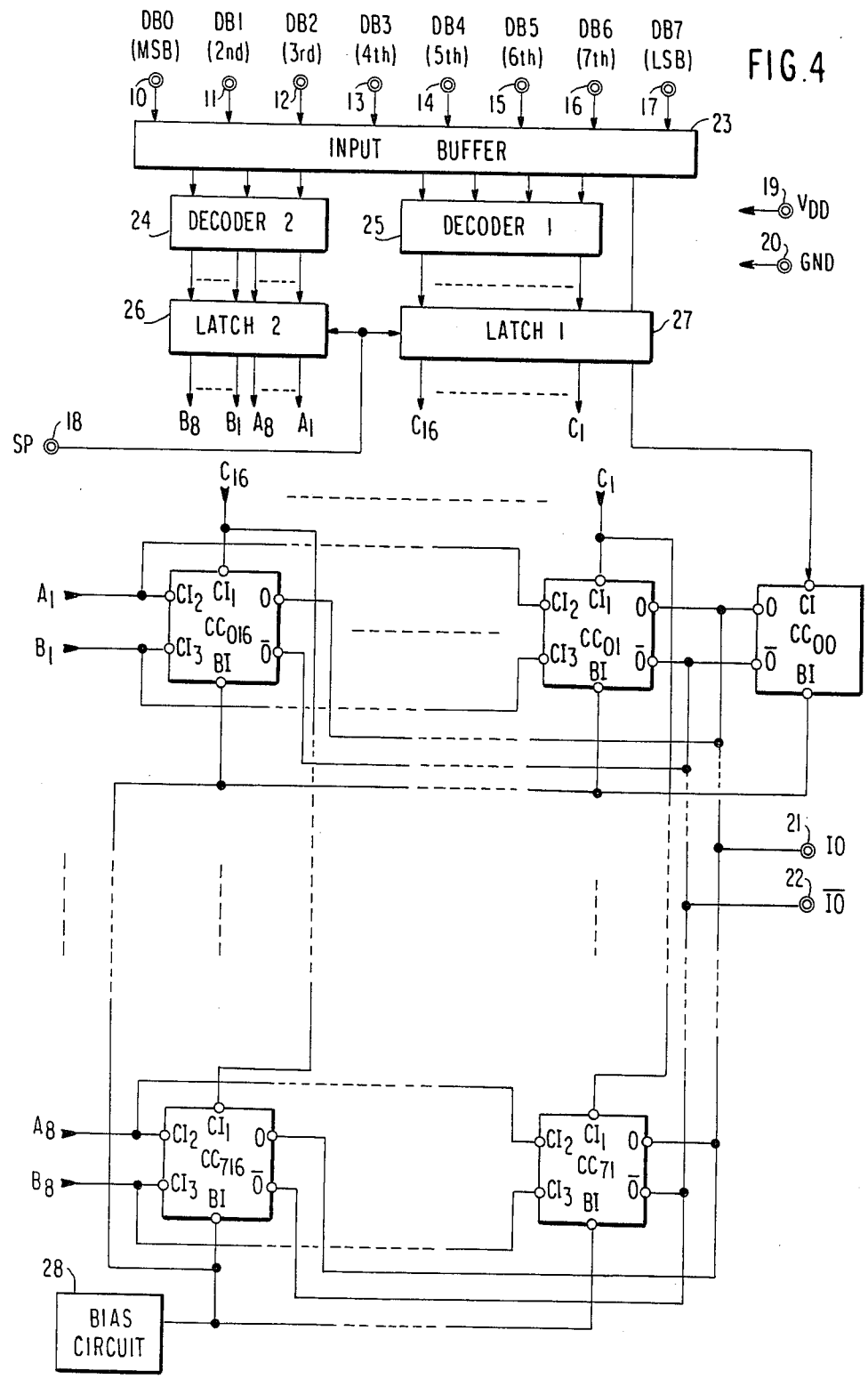
FIG. 4 is a circuit diagram representing a fourth embodiment of the present invention.

FIG. 4 illustrates the fourth embodiment of the present invention, which is a current summing type D/A converter.

Digital data in the form of 8 bit words $DB_0$–$DB_7$ from input terminals 10–17 are fed to an input buffer 23. Of the digital data, the least significant bit (LSB) $DB_7$ and the 4th through 7th bits, $DB_3$ through $DB_6$ are supplied to a first latch circuit 27 via a first decoder 25. The first decoder 25 generates and applies first control signals $C_1$–$C_{16}$ to the first latch circuit 27 on the basis of the bits $DB_3$–$DB_6$. The most significant digit (MSB) $DB_0$, the 2nd bit $DB_1$ and the 3rd bit $DB_2$ are supplied to a second decoder 24. The second decoder 24 generates and applies second control signals $A_1$–$A_8$ and third control signals $B_1$–$B_8$ to a second latch circuit 26. The latch circuits 26 and 27 latch the first through third control signals and the bit $DB_7$ in response to a sampling pulse SP supplied from a terminal 18.

$CC_{01}$ through $CC_{716}$ are current cells arranged in matrix form. Each current cell has first through third control input terminals $CI_1$ through $CI_3$, first and second output terminals O and $\overline{O}$ and a bias input terminal BI connected to a bias circuit 28. The details of the current cell circuit construction will be explained referring to FIG. 5.

The first control terminals $CI_1$ of those current cells arranged in the same column are connected in common and the first control signals $C_1$–$C_{16}$ from the first latch circuit 27 are supplied to the cells in respective columns, as shown. The second and third control terminals $CI_2$ and $CI_3$ of cells arranged in the same row or line are respectively connected in common, and the second and third control signals A ($A_1$–$A_8$) and B($B_1$–$B_8$) from the second latch circuit 26 are fed thereto, respectively, as shown. The first output terminals O, the second output terminals $\overline{O}$ and the bias input terminals BI of the current cells $CC_{01}$ through $CC_{716}$ are respectively commonly connected with a first current output terminal 21, a second current output terminal 22 and an output terminal of the bias circuit 28. It is noted here that the current capacities of the current cells $CC_{01}$ through $CC_{716}$ are substantially the same. Each of the current cells $CC_{01}$ through $CC_{716}$ generates a current from its first output terminal O when its first and second control signals $C_{(n)}$, $A_{(n)}$ are at the "HIGH" level or when the third control signal B is at the "HIGH" level, and generates a current from its second output terminal $\overline{O}$ otherwise.

A current cell $CC_{00}$, which has half the current capacity of the other current cells, generates a current from its first output terminal O and from its second output terminal $\overline{O}$ when the bit $DB_7$ takes the values "1" and "0", respectively. The first and second output terminals O and $\overline{O}$ of the cell $CC_{00}$ are connected in common with outputs 21, 22, respectively.

The first decoder 25 generates a decoded signal, as shown in table 1, which determines the levels of the first control signals $C_1$ through $C_{16}$, responsive to the bits $DB_3$ through $DB_6$.

TABLE 1

| $DB_3$ | $DB_4$ | $DB_5$ | $DB_6$ | $C_1$ | $C_2$ | $C_3$ | $C_4$ | $C_5$ | $C_6$ | $C_7$ | $C_8$ | $C_9$ | $C_{10}$ | $C_{11}$ | $C_{12}$ | $C_{13}$ | $C_{14}$ | $C_{15}$ | $C_{16}$ |
|---|---|---|---|---|---|---|---|---|---|---|---|---|---|---|---|---|---|---|---|
| 0 | 0 | 0 | 0 | L | L | L | L | L | L | L | L | L | L | L | L | L | L | L | L |
| 0 | 0 | 0 | 1 | H | L | L | L | L | L | L | L | L | L | L | L | L | L | L | L |
| 0 | 0 | 1 | 0 | H | H | L | L | L | L | L | L | L | L | L | L | L | L | L | L |
| 0 | 0 | 1 | 1 | H | H | H | L | L | L | L | L | L | L | L | L | L | L | L | L |
| 0 | 1 | 0 | 0 | H | H | H | H | L | L | L | L | L | L | L | L | L | L | L | L |
| 0 | 1 | 0 | 1 | H | H | H | H | H | L | L | L | L | L | L | L | L | L | L | L |
| 0 | 1 | 1 | 0 | H | H | H | H | H | H | L | L | L | L | L | L | L | L | L | L |
| 0 | 1 | 1 | 1 | H | H | H | H | H | H | H | L | L | L | L | L | L | L | L | L |
| 1 | 0 | 0 | 0 | H | H | H | H | H | H | H | H | L | L | L | L | L | L | L | L |
| 1 | 0 | 0 | 1 | H | H | H | H | H | H | H | H | H | L | L | L | L | L | L | L |
| 1 | 0 | 1 | 0 | H | H | H | H | H | H | H | H | H | H | L | L | L | L | L | L |
| 1 | 0 | 1 | 1 | H | H | H | H | H | H | H | H | H | H | H | L | L | L | L | L |
| 1 | 1 | 0 | 0 | H | H | H | H | H | H | H | H | H | H | H | H | L | L | L | L |
| 1 | 1 | 0 | 1 | H | H | H | H | H | H | H | H | H | H | H | H | H | L | L | L |
| 1 | 1 | 1 | 0 | H | H | H | H | H | H | H | H | H | H | H | H | H | H | L | L |
| 1 | 1 | 1 | 1 | H | H | H | H | H | H | H | H | H | H | H | H | H | H | H | L | where "H" and "L" are "HIGH" and "LOW" levels, respectively.

The second decoder 24 generates a decoded signal, as shown in Table 2, determining the levels of the second control signals $A_1$–$A_8$ and the third control signals $B_1$–$B_8$.

TABLE 2

| $DB_0$ | $DB_1$ | $DB_2$ | $A_1$ | $A_2$ | $A_3$ | $A_4$ | $A_5$ | $A_6$ | $A_7$ | $A_8$ | $B_1$ | $B_2$ | $B_3$ | $B_4$ | $B_5$ | $B_6$ | $B_7$ | $B_8$ |
|---|---|---|---|---|---|---|---|---|---|---|---|---|---|---|---|---|---|---|
| 0 | 0 | 0 | H | L | L | L | L | L | L | L | L | L | L | L | L | L | L | L |
| 0 | 0 | 1 | L | H | L | L | L | L | L | L | H | L | L | L | L | L | L | L |
| 0 | 1 | 0 | L | L | H | L | L | L | L | L | H | H | L | L | L | L | L | L |
| 0 | 1 | 1 | L | L | L | H | L | L | L | L | H | H | H | L | L | L | L | L |
| 1 | 0 | 0 | L | L | L | L | H | L | L | L | H | H | H | H | L | L | L | L |
| 1 | 0 | 1 | L | L | L | L | L | H | L | L | H | H | H | H | H | L | L | L |
| 1 | 1 | 0 | L | L | L | L | L | L | H | L | H | H | H | H | H | H | L | L |
| 1 | 1 | 1 | L | L | L | L | L | L | L | H | H | H | H | H | H | H | H | L |

As a result, the output current I at the first current output terminal 21 increases stepwise by the current capacity of the current cell $CC_{00}$ with each increase by "1" of the input digital data $DB_0$ through $DB_7$. On the other hand, the current $\overline{I}$ from the second current output terminal incrementally decreases at the same rate.

Figure 5:
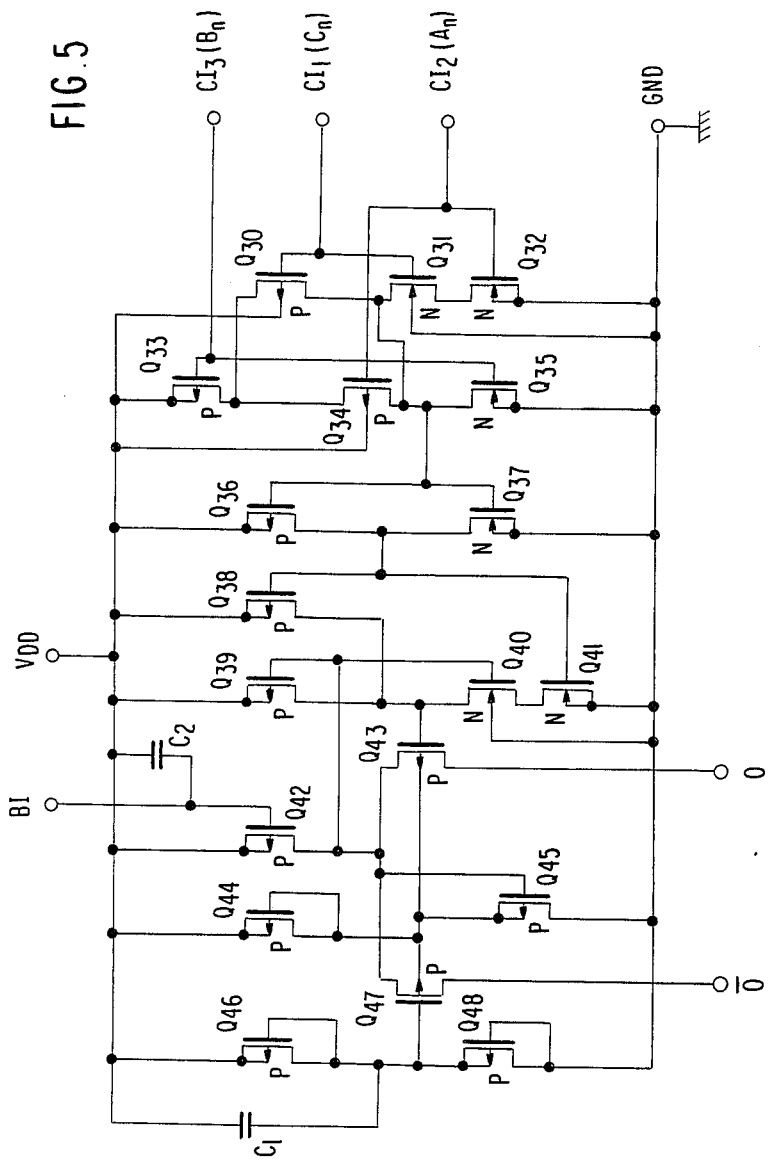
FIG. 5 is a circuit diagram indicating the current cell circuit shown in FIG. 4.

FIG. 5 represents a detailed circuit diagram of each of the current cells $CC_{01}$ through $CC_{716}$. Transistors $Q_{33}$ through $Q_{35}$ are sequentially connected between the power source $V_{DD}$ and the ground level GND. The third control signal B is applied to the gates of the transistors $Q_{33}$ and $Q_{35}$ through the third input terminal $CI_3$. Between the drain of transistor $Q_{33}$ and ground are connected transistors $Q_{30}$ through $Q_{32}$. The first control signal C is applied to the gates of the transistors $Q_{30}$, $Q_{31}$ through the first input terminal $CI_1$. To the gates of the transistors $Q_{32}$, $Q_{34}$ the second control signal A is fed through the second input terminal $CI_2$. With this circuit configuration, a "LOW" level signal appears at the connection point of the transistors $Q_{34}$, $Q_{35}$ when both the first and second control signals $C_{(n)}$, $A_{(n)}$ are "HIGH", or when the second control signal B is "HIGH".

The signal appearing at this connection point is inverted in an inverter composed of transistors $Q_{36}$, $Q_{37}$, and the inverted signal is applied to the gate of transistors $Q_{38}$, $Q_{41}$. A transistor $Q_{40}$ is inserted between the transistors $Q_{38}$ and $Q_{41}$, and a transistor $Q_{39}$ is connected to the transistor $Q_{38}$ in parallel. A transistor $Q_{42}$, having a gate supplied with a bias voltage through the bias terminal $B_f$, operates as a constant current source. Condensors $C_1$ and $C_2$ are used as filters.

Transistors $Q_{43}$, $Q_{47}$ have their sources connected to the drain of the transistor $Q_{42}$ and their back gates supplied with the source voltage through a source follower amplifier of unity gain comprised of transistors $Q_{44}$ and $Q_{45}$ in accordance with the present invention, to prevent the threshold increase of the transistors $Q_{43}$ and $Q_{47}$. The gates of the transistors $Q_{43}$ and $Q_{47}$ are connected to the connection points between the transistors $Q_{39}$ and $Q_{40}$ and between the transistors $Q_{46}$ and $Q_{48}$. To the gates of the transistors $Q_{39}$ and $Q_{40}$, the source voltage of the transistors $Q_{43}$ and $Q_{47}$ is applied. Accordingly, if a "LOW" signal appears at the connection point of the transistors $Q_{34}$ and $Q_{35}$, the gate voltage of the transistor $Q_{43}$ is lower than that of the transistor $Q_{47}$, generating a constant current from the transistor $Q_{42}$ at the first output terminal O through the transistor $Q_{43}$. In contrast, the current output appears at the second output terminal $\overline{O}$ through the transistor $Q_{47}$, if the signal at the connection point of the transistors $Q_{34}$ and $Q_{35}$ is at the "HIGH" level.

As will be clearly understood, since the source electrode of the MOS transistor is not connected to the back gate, the large capacitance at the junction between the back gate region and the substrate is not applied to the source electrode. This makes it possible to obtain high speed operation. The input capacitance of the amplifier is applied to the source electrode, but this capacitance is much smaller than that at the junction.

Since the source electrode and the back gate region of the MOS transistor are kept at the same potential through an amplifier having a gain of about "1", moreover, the so-called "substrate bias effect" is not caused and the threshold voltage is not varied.

What is claimed is:

1. A MOS type circuit comprising:
   first and second MOS transistors each having source, drain and gate electrodes and a back gate region, said first and second MOS transistors being operated by input clock signals supplied to said respective gate electrodes; and
   a third MOS transistor having a gate electrode coupled to the source electrodes of said first and second MOS transistors and having a source electrode coupled to the back gates of said first and second MOS transistors.

2. A MOS type circuit according to claim 1, further comprising a constant current source coupled to the source electrodes of said first and second MOS transistors, and first and second resistors coupled to the drain electrodes of said first and second MOS transistors.

3. A MOS type circuit according to claim 1, wherein said first and second MOS transistors are P channel transistors.

4. A MOS type circuit according to claim 1, wherein said first and second MOS transistors are N channel transistors.

5. In a D/A converter circuit of a type employing a plurality of current cell circuits, each of which generates a predetermined current responsive to an input digital signal, the currents generated by said current cell circuits being summed and outputted as a converted analog signal of said digital signal, the improvement wherein each of said current cell circuits comprises:

a pair of MOS transistors each having source, drain and gate electrodes and a back gate region;
said source electrodes and said back gate region being respectively coupled to each other;
amplifier means coupled between the source electrodes of said pair of MOS transistors and said back gates of said pair of MOS transistors;
a constant current source circuit coupled to the source electrodes of said pair of MOS transistors;
means coupled to at least one of the gate electrodes of said pair of MOS transistors for applying a signal responsive to said input digital signal thereto; and
means coupled to the drain electrodes of said pair of MOS transistors for deriving a pair of output currents therefrom.

6. A circuit as claimed in claim 5, wherein said amplifier means comprises a unity gain amplifier comprising a pair of MOS transistors, a first of said transistors being coupled between said back gates and ground, and being coupled at its gate to said source electrodes, and a second of said transistors being coupled between a voltage supply terminal and said back gates.

7. A MOS type circuit comprising:
   first and second MOS transistors each having source, drain and gate electrodes and a back gate region, said first and second MOS transistors being operated by input clock signals supplied to said respective gate electrodes; and
   an amplifier having a gain of about "1", the input and the output of said amplifier being respectively coupled to the source electrodes and back gates of said first and second MOS transistors.

8. A MOS circuit according to claim 7, further comprising a constant current source coupled to the source electrodes of said first and second MOS transistors, and first and second resistors coupled to the drain electrodes of said first and second MOS transistors.

9. A MOS type circuit comprising:
   an MOS transistor having source, drain and gate electrodes and a back gate region;
   an amplifier having a gain of about "1", an input and an output of said amplifier being respectively coupled to said source electrode and said back gate region of said MOS transistor;
   a constant current source coupled between said source electrode of said MOS transistor and a first power terminal;
   a load means coupled between said drain electrode of said MOS transistor and a second power terminal; and
   an input means coupled to said gate electrode of said MOS transistor for applying an input signal thereto.

10. A MOS type circuit comprising:
    an MOS transistor having a source-drain current path, a gate electrode and a back gate region;
    an amplifier having a gain of about "1", an input and an output of said amplifier being respectively coupled to one end of said source-drain current path and said back gate region of said MOS transistor;
    a constant current source coupled between said one end of the source-drain current path of said MOS transistor and a first power terminal;
    a load means coupled between the other end of said source-drain current path of said MOS transistor and a second power terminal; and
    an input means coupled to said gate electrode of said MOS transistor for applying an input signal thereto.

* * * * *

UNITED STATES PATENT AND TRADEMARK OFFICE
CERTIFICATE OF CORRECTION

PATENT NO. : 4,725,813

DATED : February 16, 1988

INVENTOR(S) : MIYADA

It is certified that error appears in the above-identified patent and that said Letters Patent is hereby corrected as shown below:

Column 4, line 45, delete "current$\bar{\text{I}}$." insert --current $\bar{\text{I}}$--

Signed and Sealed this

Twenty-first Day of February, 1989

Attest:

DONALD J. QUIGG

Attesting Officer     Commissioner of Patents and Trademarks